(12) United States Patent
Gandhi

(10) Patent No.: US 6,716,036 B2
(45) Date of Patent: Apr. 6, 2004

(54) METHOD OF ATTACHING CIRCUITRY TO A MODULAR JACK CONNECTOR USING ELECTRICALLY CONDUCTIVE PASTE

(75) Inventor: Pradeep Gandhi, Del Mar, CA (US)

(73) Assignee: Ormet Circuits, Inc., Carlsbad, CA (US)

(*) Notice: Subject to any disclaimer, the term of this patent is extended or adjusted under 35 U.S.C. 154(b) by 0 days.

(21) Appl. No.: 10/147,371

(22) Filed: May 15, 2002

(65) Prior Publication Data

US 2003/0216061 A1 Nov. 20, 2003

(51) Int. Cl.[7] .................... H01R 12/00; H05K 1/00; H05K 1/03; H05K 1/11; H01L 23/02
(52) U.S. Cl. .................... 439/65; 174/255; 361/792; 257/678
(58) Field of Search .................... 439/65, 620, 676, 439/68, 83; 174/255; 361/792; 257/678

(56) References Cited

U.S. PATENT DOCUMENTS

| | | | | | |
|---|---|---|---|---|---|
| 4,642,321 | A | * | 2/1987 | Schoenberg et al. | 523/400 |
| 5,661,339 | A | * | 8/1997 | Clayton | 257/678 |
| 5,708,297 | A | * | 1/1998 | Clayton | 257/723 |
| 5,731,663 | A | * | 3/1998 | Davis | 315/194 |
| 5,841,064 | A | * | 11/1998 | Maekawa et al. | 136/203 |
| 6,021,050 | A | * | 2/2000 | Ehman et al. | 361/793 |

\* cited by examiner

Primary Examiner—Chandrika Prasad
(74) Attorney, Agent, or Firm—Stephen E. Reiter; Foley & Lardner

(57) ABSTRACT

Disclosed are electrical connector devices with integrated electronic components, including magnetic devices. The electronic components integrated into the connector are electrically connected to one another and the connector pins by an electrically conductive circuit formed directly on the connector housing. Formation of the electrically conductive circuit directly on the connector housing substantially reduces the number of assembly steps required to manufacture the connector.

16 Claims, 2 Drawing Sheets

US 6,716,036 B2

METHOD OF ATTACHING CIRCUITRY TO A MODULAR JACK CONNECTOR USING ELECTRICALLY CONDUCTIVE PASTE

FIELD OF THE INVENTION

The present invention relates to the field of electrical connectors for electronic equipment. Specifically, the present invention relates to modular jack connectors with an integrated magnetic module.

BACKGROUND OF THE INVENTION

There is an escalating need for computer networking hardware that can support the high frequencies associated with multi-gigabit speeds. Circuit board designers face a number of high-frequency related design challenges including high susceptibility of signal loss or distortion due to electromagnetic noise and jitter. Design and placement of countermeasures such as isolation of problem components, signal filtering, and EMI shielding requires extreme care. This attention to detail applies not only to each self-contained item of hardware, but also to the cables and connectors that tie these devices to the outside world. Often, it is these linking elements that are the Achilles heel of the system.

In addition to signal integrity issues, market demand requires that nearly all electronic hardware components must be designed with product size reduction as a goal. The trend towards smaller, more highly optimized communications devices has spurred a concurrent trend to integrate multiple system components within a single housing. The integration of magnetic interface components into standard modular jack connectors is one manifestation of this trend.

Moving the magnetic components from the circuit board into the connector improves reliability, reduces electromagnetic noise, and provides size reduction and design simplification benefits to the printed circuit board. Reliability of the magnetics is improved due to the reduction of heat exposure during assembly. Noise is reduced by isolating and shielding the magnetics from the long traces and problem components of the circuit board. Simplification of design and reduction of the overall size of the printed circuit board are achieved because one connector can take the place of many components. Use of an integrated connector thus improves performance and reliability, promotes miniaturization and reduces manufacturing costs by streamlining manufacturing.

In prior art integrated connectors, for instance U.S. Pat. No. 5,069,641, the magnetic components as well as other components such as termination resistors are assembled onto a small printed circuit board that fits within the connector housing. Plated through-holes at opposite ends of the printed circuit board accept sets of pins that will connect to the hardware and the cable. To assemble the connector, pins are pre-attached to the circuit board through the holes at one end, the attached pins are slipped through holes in the housing as the circuit board is slipped into its molded slot in the housing, and then the second set of pins are inserted into the plated through-holes at the opposite end of the circuit board. The housing has a molded set of grooves that holds the second set of pins in an array in which they are electrically isolated from one another. This subassembly—housing, printed circuit board, and two sets of pins—is then assembled into the modular jack body, thus protecting the circuit board and its sensitive components.

Although prior art integrated connectors provide a number of benefits over modular jacks without integrated components, the sensitive components can easily be damaged by handling or heat exposure during the multiple assembly steps. An improved design requiring fewer assembly steps would, therefore, be of significant benefit.

OBJECTS OF THE INVENTION

It is, therefore, an object of the present invention to provide integrated connector assemblies that have the following improvements over prior art integrated connectors:

(a) require fewer assembly operations, (b) have reduced thermal exposure to the magnetic components, and (c) have a higher manufacturing yield.

These and other objects of the invention will become apparent upon review of the specification and appended claims.

SUMMARY OF THE INVENTION

In accordance with the present invention, the circuit for the integrated components is printed directly on the housing for the connector, rather than fabricated as a separate circuit board. The circuit is formed from a metal-filled polymer paste that is thermally processed at or below typical solder reflow temperatures to form an electrical conductor. The paste is deposited using any one of a number of methods, such as screen-printing or needle dispensing, commonly known to those of skill in the art. The components to be integrated may then be attached directly to the circuit, or in an alternative embodiment, may be placed into the unprocessed conductive paste to achieve component attachment and circuit formation in a single step. Likewise, the pins may be attached to the circuit after the conductive paste has been cured or may be placed into the wet paste for concurrent pin-attachment and conductive paste curing.

The present invention thus provides novel electrical connectors and methodology which allows one to substantially reduce the number of assembly steps required for the manufacture of integrated connectors. Because the circuit is directly integrated with the connector housing, the order in which the pins and components are attached to the circuit can be manipulated to provide an optimum manufacturing flow that minimizes potential damage to the components. The potential to complete all assembly steps without ever exposing the magnetic components to solder reflow temperatures can substantially improve the reliability and performance of these sensitive components. In addition, the points of attachment of the pins to the circuit may be encased in potting compound along with the integrated components thus providing the connector with improved mechanical ruggedness and resistance to adverse environmental conditions.

The present invention may be better understood by reference to the accompanying non-limiting illustrative drawings and detailed description.

Figure 1:
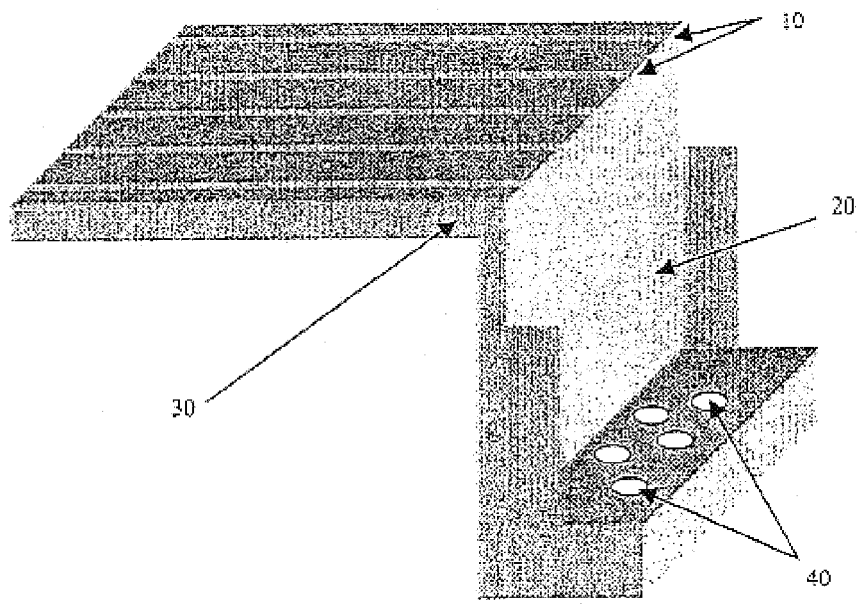
FIG. 1 depicts one piece of a two-piece connector housing. The plastic housing piece (30) has grooves (10) molded into one surface to accept connector pins. Holes (40) are molded into another surface of the plastic housing piece (30) to accept a second set of connector pins. Between the faces on the plastic housing piece bearing the grooves (10) and holes (40) is a slot (20) composed of a sheer face and guides arranged perpendicular to the face.
Figure 2:
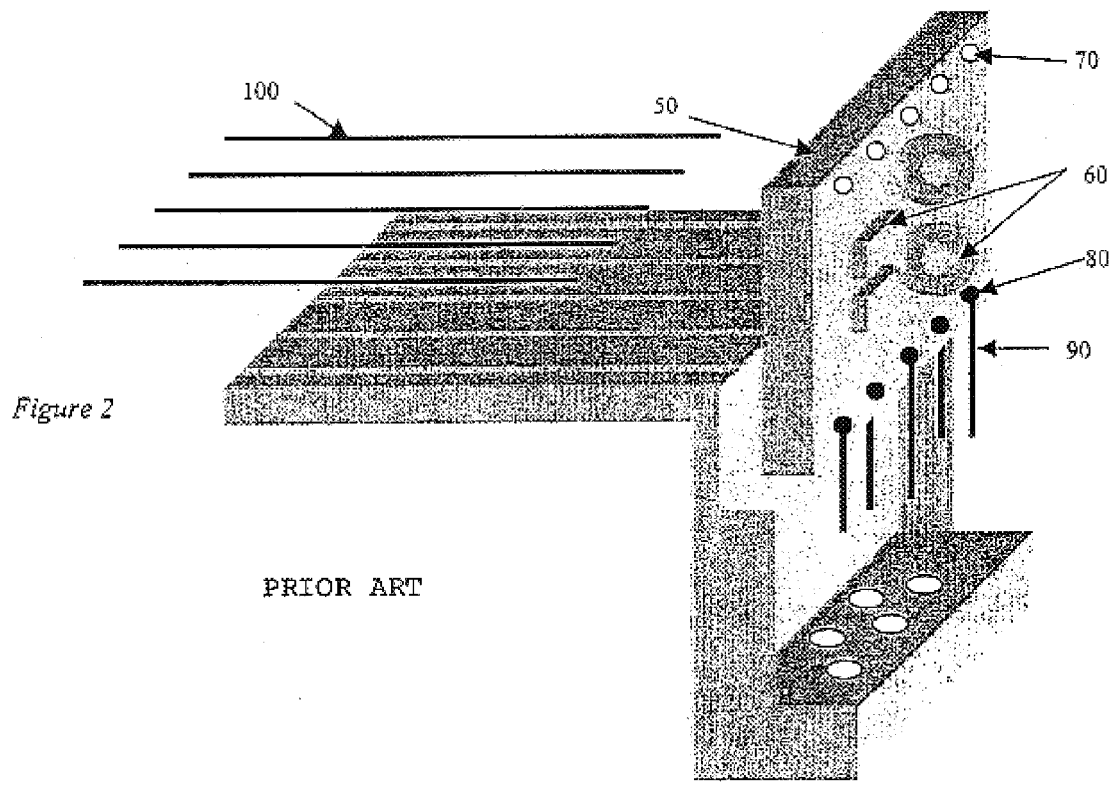
FIG. 2 illustrates a prior art connector, wherein the slot (20) accepts a printed circuit board (50). Prior to insertion into slot (20), the printed circuit board is assembled with electronic components (60) and the electronic components are encased in an encapsulant (not shown) to protect them from environmental exposure. In addition to the electronic components, prior to insertion one set of connector pins (90) is attached to a row of plated through-holes (80) at one end of the printed circuit board.

To assemble the connector, connector pins (90) are inserted through holes (40) as the printed circuit board is positioned into slot (20). A second set of connector pins (100) is then positioned into the grooves (10) in the plastic housing piece (30) and the second set of connector pins (100) are inserted into a second set of plated through-holes (50) at the opposite end of the printed circuit board. The second set of connector pins (100) is permanently attached to the printed circuit board (50) with solder. This subassembly is then joined with the second piece of the two-piece plastic connector housing.

Figure 3:
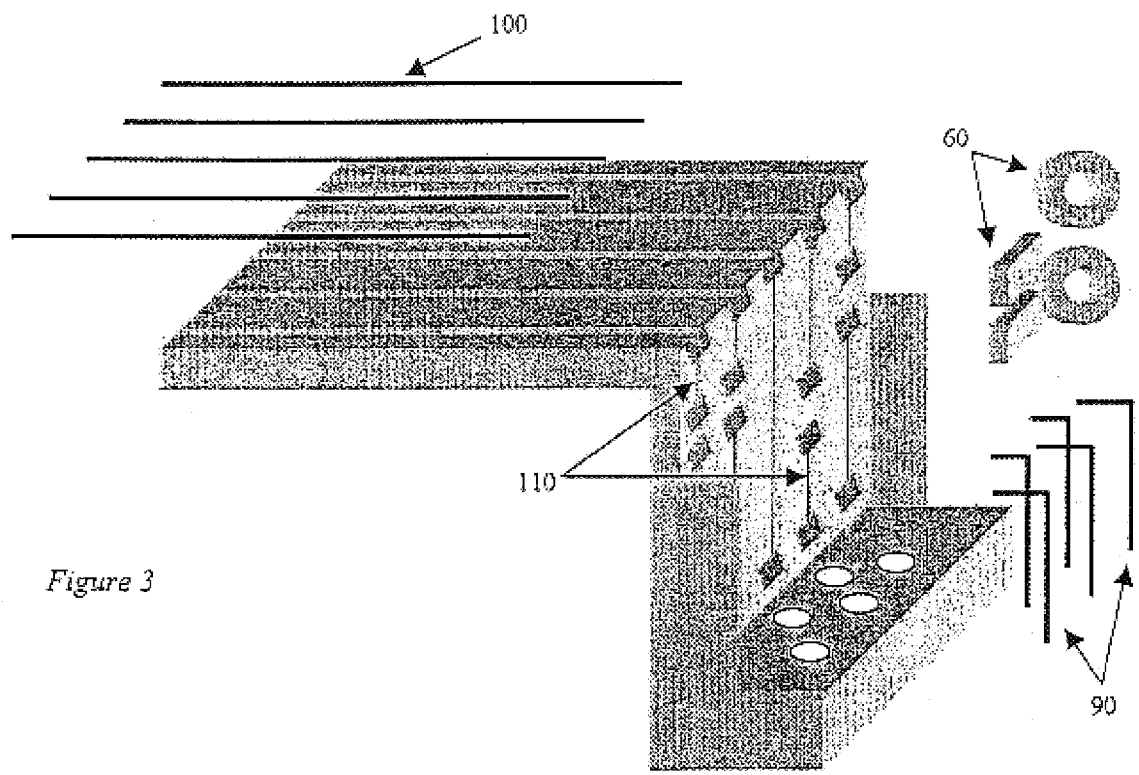

FIG. 3 depicts one embodiment of the instant invention. Instead of inserting a separate printed circuit board into slot (20), an electrically conductive circuit (110) is deposited directly onto the plastic housing piece (30). The electrically conductive circuit is created using an electrically conductive paste material deposited by any of several methods known to those of skill in the art. The electrically conductive circuit thus deposited has circuit traces and pads. Connector pins (100) and (90), and electronic components (60) can be attached to the electrically conductive circuit (110) in any order required and at various stages of processing of the electrically conductive paste. It will be appreciated by those of skill in the art that the connector housing could be redesigned to facilitate some methods of deposition of the conductive paste.

DETAILED DESCRIPTION OF THE INVENTION

In accordance with the present invention, there are provided electrical connectors comprising:
   a. a connector housing,
   b. an electrically conductive circuit formed upon said housing,
   c. electronic components attached to said electrically conductive circuit, and
   d. pins electrically connected to said electrically conductive circuit.

According to the present invention, the circuit for the integrated components is printed directly on the housing for the connector, rather than fabricated as a separate circuit board. It will be appreciated by those of skill in the art that it may be beneficial to redesign the connector housing with regard to material and/or shape to fully exploit the benefits of the present invention. The connector housing may be formed from any one of a number of plastic materials commonly used to form molded parts for electronic devices, such as, for example, polyacrylates, polyesters, polycarbonates, liquid crystal polymers, and the like. Certain types of plastic materials may be preferred, for instance, due to improved adhesion with the conductive paste material, or improved resistance to the thermal exposure required to process the conductive paste. Redesign of the shape of the connector housing may be beneficial to facilitate use of high volume deposition techniques such as screen-printing, or simply to streamline the part.

The circuit is formed from a metal-filled polymer paste that is thermally processed at or below typical solder reflow temperatures to form an electrical conductor. Electrically conductive paste materials applicable to the present invention include polymeric compositions filled with electrically conductive particles such as metal powders, metal-coated powders and graphite. Inherently conductive polymers might also be employed in the present invention. Transient liquid phase sintering (TLPS) materials of the type described in U.S. Pat. No. 5,830,389, incorporated by reference herein in its entirety, are presently preferred.

The electrically conductive metal-filled polymer paste can be deposited in a variety of ways, such as, for example, by needle dispensing, screen-printing, stencil-printing, transfer printing, or other methods known to those of skill in the art. Screen-printing is currently the preferred method of deposition.

As readily recognized by those of skill in the art, a wide variety of electronic components can be attached to the electrically conductive circuit created according to the invention, such as, for example, resistors, capacitors, inductors, common mode choke coils, and the like. The electronic components to be integrated into the connector may be attached directly to the circuit formed from thermally processed electrically conductive paste, or in an alternative embodiment, may be placed into the unprocessed conductive paste to achieve component attachment and circuit formation in a single step.

Likewise, connector pins may be attached to the circuit after the conductive paste has been thermally processed or may be placed into the wet paste for concurrent pin-attachment and conductive paste curing. It will be appreciated by those of skill in the art that the shape of the connector pins or the mode in which they are inserted into the connector housing may require redesign to fully exploit the benefits of the present invention. For instance, connector pins (100) would have to be bent to contact the flat pads at the top of the circuit (110) instead of passing into through-holes (70).

In an alternative embodiment, the electronic components and connector pins may all be attached to the circuit simultaneously, either before or after thermal processing of the electrically conductive paste. The instant invention thus provides means to substantially reduce the number of assembly steps in the manufacture of integrated connectors.

Because the circuit is directly integrated with the connector housing, the order in which the pins and components are attached to the circuit can be manipulated to provide an optimum manufacturing flow that minimizes potential damage to the components. Electronic components may be attached to the circuit using solder, electrically conductive adhesive materials or the electrically conductive paste material used to form the circuit. Either the electrically conductive adhesive material or the electrically conductive paste material will likely be thermally processed at a temperature below that of common solder. The potential to complete all assembly steps without ever exposing the magnetic components to solder reflow temperatures can substantially improve the reliability and performance of these sensitive components.

The electronic components that are attached to the printed circuit board in prior art integrated connectors are typically encapsulated in a clear polymer to protect them from handling and environmental degradation. In accordance with the present invention, it is also contemplated to encapsulate the points of attachment of the pins to the circuit to extend the mechanical and environmental protection afforded by such an encapsulant.

Manufacturing yields of integrated connectors fabricated in accordance with the present invention are anticipated to be higher due to the reduction of manufacturing steps—particularly those requiring hand assembly—and the reduced handling and thermal exposure of the magnetic components.

Although the present invention has been described in conjunction with the embodiments above, it is to be noted that various changes and modifications are apparent to those who are skilled in the art. Such changes and modifications are to be understood as included within the scope of the present invention defined by the appended claims.

What is claimed is:

1. An electrical connector comprising:
   a. a connector housing,
   b. an electrically conductive circuit formed from a transient liquid phase sintering material upon said housing,
   c. electronic components attached to said electrically conductive circuit, and
   d. pins electrically connected to said electrically conductive circuit.

2. The electrical connector of claim 1, wherein said electronic components are selected from resistors, capacitors, inductors, and common mode choke coils.

3. A method for preparing an integrated modular jack connector, said method comprising:
   applying transient liquid phase sintering material to a substrate in a pre-determined pattern,
   subjecting said coated substrate to conditions suitable to cure said transient liquid phase sintering material, thereby forming an electrically conductive circuit on said substrate, and thereafter
   optionally connecting one or more electronic components and/or one or more connector pins to the electrically conductive circuit.

4. A method according to claim 3 wherein said transient liquid phase sintering material is applied to said substrate by needle dispensing, screen-printing, stencil-printing, or transfer printing.

5. A method according to claim 4 wherein said transient liquid phase sintering material is applied to said substrate by screen-printing.

6. A method according to claim 3 wherein the point of attachment of said pins to said circuit is encapsulated.

7. A method according to claim 3 wherein the point of attachment of said electronic component to said circuit is encapsulated.

8. A method for preparing an integrated modular jack connector, said method comprising:
   applying transient liquid phase sintering material to a substrate in a pre-determined pattern,
   placing one or more electronic components and/or one or more connector pins in contact with said transient liquid phase sintering material, and
   subjecting said coated substrate to conditions suitable to cure said transient liquid phase sintering material, thereby forming an electrically conductive circuit on said substrate.

9. A method according to claim 8 wherein said transient liquid phase sintering material is applied to said substrate by needle dispensing, screen-printing, stencil-printing, or transfer printing.

10. A method according to claim 9 wherein said transient liquid phase sintering material is applied to said substrate by screen-printing.

11. A method according to claim 8 wherein the point of attachment of said pins to said circuit is encapsulated.

12. A method according to claim 8 wherein the point of attachment of said electronic component to said circuit is encapsulated.

13. The electrical connector of claim 1 wherein said electronic components are encapsulated.

14. The electrical connector of claim 1 wherein said pins are encapsulated.

15. The electrical connector of claim 1 wherein said transient liquid phase sintering material is cured at a temperature substantially below conventional soldering temperatures.

16. The electrical connector of claim 1 wherein the transient liquid phase sintering material comprises metal, metal-coated, or graphite particles in a polymer matrix.

* * * * *